(12) United States Patent
Cai

(10) Patent No.: US 11,049,576 B1
(45) Date of Patent: Jun. 29, 2021

(54) POWER-ON-RESET FOR MEMORY

(71) Applicant: Micron Technology, Inc., Boise, ID (US)

(72) Inventor: Liuchun Cai, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/722,132

(22) Filed: Dec. 20, 2019

(51) Int. Cl.
*G11C 16/34* (2006.01)
*G11C 16/30* (2006.01)
*G06F 1/24* (2006.01)
*G11C 11/4093* (2006.01)
*G11C 16/12* (2006.01)

(52) U.S. Cl.
CPC .......... *G11C 16/34* (2013.01); *G06F 1/24* (2013.01); *G11C 11/4093* (2013.01); *G11C 16/12* (2013.01); *G11C 16/30* (2013.01)

(58) Field of Classification Search
CPC ..... G11C 16/34; G11C 11/4093; G11C 16/12; G11C 16/30; G06F 1/24
See application file for complete search history.

(56) References Cited

U.S. PATENT DOCUMENTS

| | | | |
|---|---|---|---|
| 6,085,342 A * | 7/2000 | Marholev | G06F 11/1441 327/143 |
| 6,188,257 B1 | 2/2001 | Buer | |
| 6,868,500 B1 * | 3/2005 | Kutz | G06F 1/24 323/266 |
| 7,564,279 B2 | 7/2009 | Tang et al. | |
| 2009/0121701 A1 | 5/2009 | Kim et al. | |
| 2015/0130519 A1 | 5/2015 | Amick et al. | |
| 2016/0359485 A1 | 12/2016 | Chen et al. | |
| 2018/0076810 A1 | 3/2018 | Hietala et al. | |
| 2018/0323780 A1 | 11/2018 | Chen et al. | |

OTHER PUBLICATIONS

Yasuda, et al., "A Power-On Reset Pulse Generator for Low Voltage Applications," IEEE, Sep. 2001, IBM Japan, Yasu Technology Application Laboratory, Shiga 520-2392, Japan, pp. IV-598-IV-601.
Lazar, et al., "A Bandgap Reference Circuit Design for Power-on Reset Related Circuits," IEEE, Mar. 2009, Faculty of Electronics, Telecommunications and Information Technology, "Gh. Asachi" Technical University if Iasi, Romania, Institute of Computer Science, Romanian Academy-Iasi Branch, Iasi, Romania, 4 pages.

(Continued)

*Primary Examiner* — Tuan T Nguyen
(74) *Attorney, Agent, or Firm* — Brooks, Cameron & Huebsch, PLLC

(57) ABSTRACT

A system can include a voltage generator configured to generate a reference voltage, a power-up voltage, and a replicated voltage based on a power supply voltage. The system can further include a logic sub-component coupled to the voltage generator and configured to output a reset signal based on a comparison of the reference voltage to the power-up voltage and an indication that the reference voltage that has entered a steady state and is reliable as a measurement with respect to a voltage level of the power supply voltage. The indication can be determined based on a comparison of the replicated voltage to a particular threshold voltage level.

20 Claims, 7 Drawing Sheets

(56) References Cited

OTHER PUBLICATIONS

Boni, "Op-Amps and Startup Circuits for CMOS Bandgap References With Near 1-V Supply," IEEE Journal of Solid-State Circuits, vol. 37, No. 10, Oct. 2002, 5 pages.

International Search Report and Written Opinion from related international application No. PCT/US2020/064748 dated Apr. 5, 2021, 11 pages.

* cited by examiner

POWER-ON-RESET FOR MEMORY

TECHNICAL FIELD

Embodiments of the disclosure relate generally to memory sub-systems, and more specifically, relate to power-on-reset for memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a memory sub-system, in particular to memory sub-systems that include a power-on-reset (POR) component. A memory sub-system can be a storage device, a memory module, or a hybrid of a storage device and memory module. Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

Power-on-reset (POR) circuitry (e.g., component) is often used in memory sub-systems to ensure proper functionality of the sub-systems when power (e.g., power supply voltage) is initially applied to the sub-systems. For example, the POR circuitry can prevent various internal logic circuitries, such as latches, flip-flops, and/or registers, of the sub-systems from functioning until after the POR circuitry determines that the power supply voltage has reached a particular voltage level.

However, various POR circuitries can have drawbacks. For example, some POR circuitries (e.g., resistor-capacitor (RC)-based POR circuitries) can be limited in its capability of using a wide range of resistance and/or capacitance values due to a limited size of the POR circuitries and/or a limited speed at which the power supply voltage increases. For example, some POR circuitries (e.g., diode-based POR circuitries) may not function properly when the power supply voltage being supplied to the POR circuitries is of a relatively small value compared to a voltage being forwarded from the diode, which can lead to difficulties in monitoring the power supply voltage accurately. Due to these drawbacks, the POR circuitries in various approaches can be vulnerable to process-voltage-temperature (PVT) variation effects, which can lead to falsely indicating that the power supply voltage is sufficiently high to power on (e.g., reset) the memory sub-system, when the power supply voltage is actually not sufficiently high to do so.

In contrast, embodiments herein can provide a plurality of voltage generators configured to generate respective voltages based on a power supply voltage and utilize one of the generated voltages that is relatively insensitive to the PVT variation effects to indicate that another one (e.g., reference voltage) of the generated voltages is reliable as a measurement with respect to a voltage level of the power supply voltage. The capability to indicate that the other one of the voltages is reliable can reduce/eliminate instances in which the voltage level of the power supply voltage is falsely measured due to the PVT variation effects, among other benefits.

Figure 1:
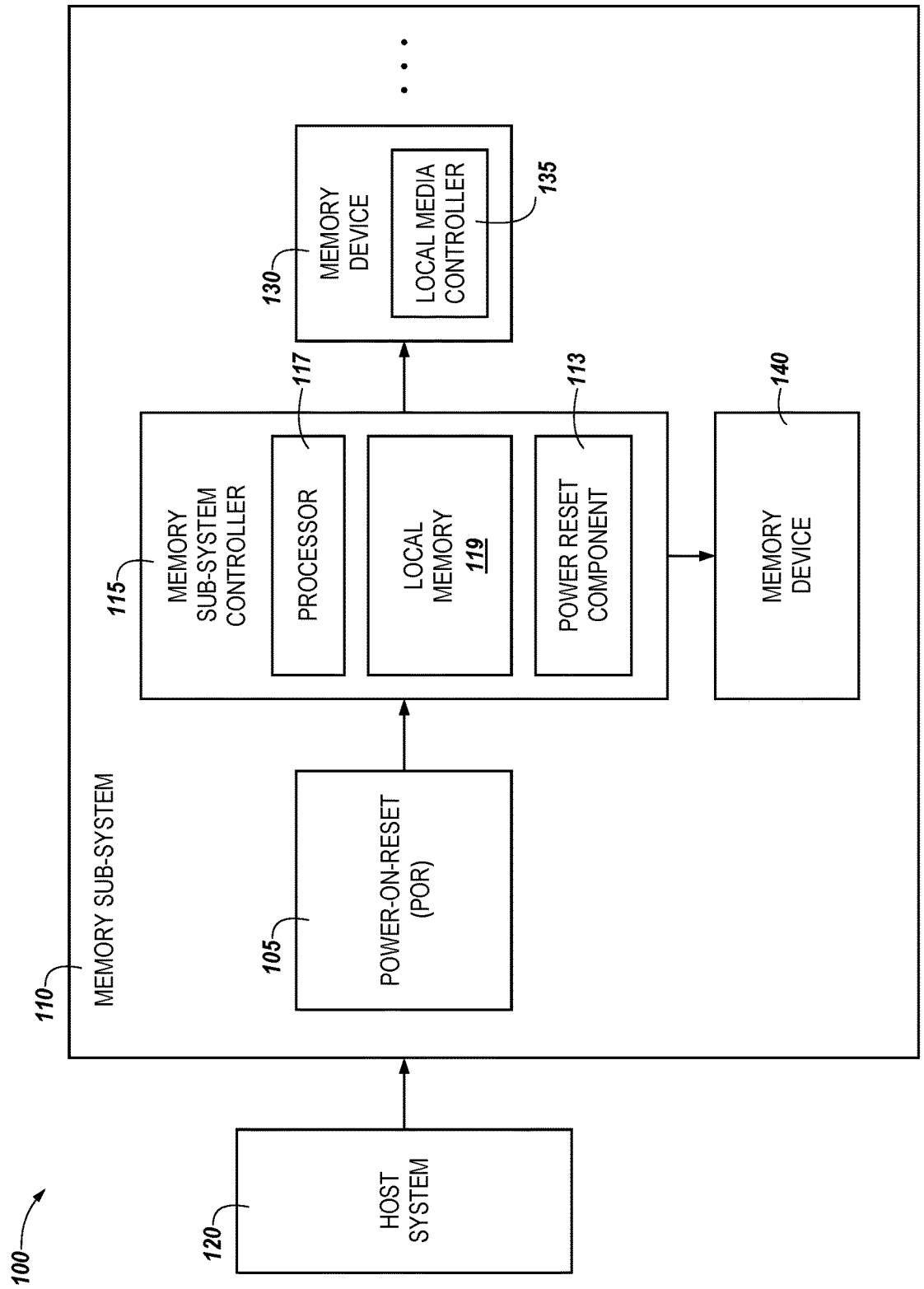
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access the components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND types memory (e.g., 2D NAND, 3D NAND) are described, the memory device 130 can be based on any other type of non-volatile memory or storage device, such as such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system controller 115 includes a power reset component 113 that can operate in combination with a POR component 105 to provide a reset signal to various components and/or circuitries of the memory sub-system 110. For example, the power reset component 113 can receive a reset signal from the POR component 105 and operate to transfer (e.g., provide) the received signal to the components and/or circuitries of the memory sub-system 110. As described herein, the POR component can be located internal to the power reset component 113 and/or the memory sub-system controller 110, although embodiments are not so limited.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a POR component 105 that can be configured to determine when to provide a reset signal to various components of the memory sub-system 110, such as memory sub-system controller 115, memory device 130, and/or memory device 140, as well as other components/circuitries, such as internal circuitries including, and not limited to, fuse circuits, reference voltage circuits, and/or charge pump circuits, among other internal circuitries that can be used to perform operations on the memory devices 130 and/or 140. Embodiments are not limited to a particular location of the memory sub-system 110 where the POR component 105 can be located. In one example, the POR component 105 can be located in a power management unit, such as a power management integrated circuit (PMIC), of the memory sub-system 110. In another example, the POR component 105 can be located internal to the memory sub-system 110, such as in the power reset component 113, and operate in combination with the power reset component 113 to perform the operations described herein.

In some embodiments, the POR component 105 can monitor a voltage level of a power supply voltage (e.g., from the host system 120), and in response to determining that the voltage level of the power supply voltage has increased to and/or reached an initial threshold voltage level, the POR component 105 can switch its power state from, for example, a reduced power state (e.g., powered-down state) to an active state. During the active state, the POR component 105 can generate a plurality of voltages based on the power supply voltage that can be utilized as measurements for indicating and/or ensuring that the power supply is highs sufficient to reset the memory sub-system 110 properly. In response to determining that a voltage level of the power supply voltage has reached a threshold, the POR component 105 can provide a reset signal to various components and/or circuitries of the memory sub-system 110 that switch their power states based on the reset signal. Various sub-components and/or circuitries of the POR component 105 are further illustrated in FIG. 2, FIG. 3, FIG. 4, FIG. 5, and FIG. 6.

Figure 2:
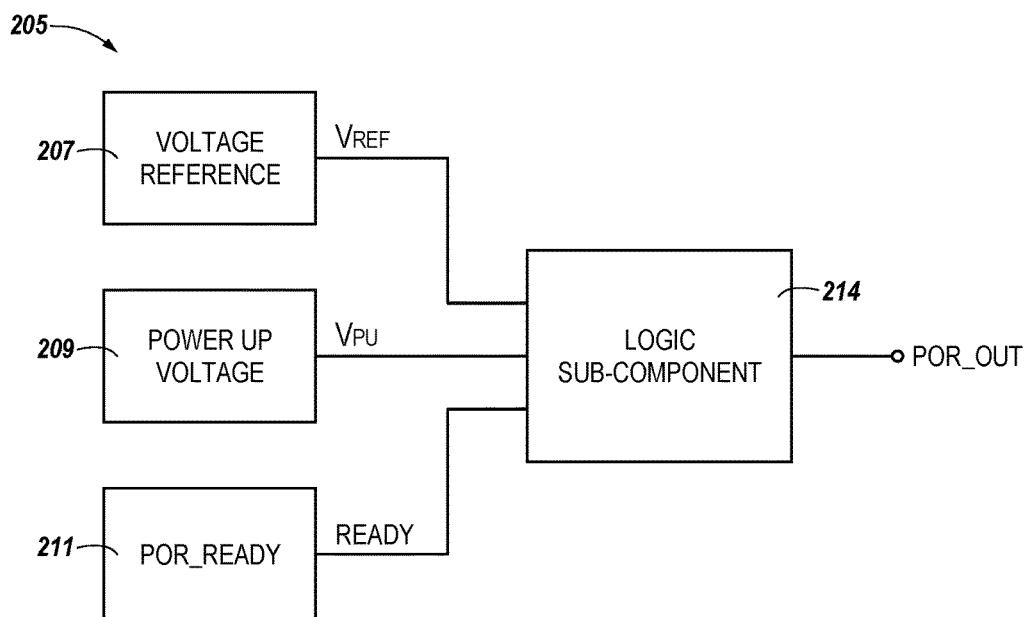
FIG. 2 illustrates example circuitry of a power-on-reset (POR) component in accordance with some embodiments of the present disclosure.

FIG. 2 illustrates example circuitry of a POR component 205 in accordance with some embodiments of the present disclosure. As shown in FIG. 2, the POR component 205 can include a plurality of voltage (e.g., and/or signal) generators, such as a reference voltage generator 207, a power-up voltage generator 209, and a ready signal generator 211 that are coupled to a logic sub-component 214. The POR component 205 can be analogous to the POR component 105 illustrated in FIG. 1.

The reference voltage generator 207 can be configured to receive a power supply voltage (e.g., from the host system 120) as an input and generate a reference voltage (e.g., shown as $V_{REF}$ in FIG. 2) based on the received power supply. In some embodiments, the reference voltage generated at the reference voltage generator 207 can be a bandgap reference voltage. As used herein, the term "bandgap reference voltage" refers to a voltage generated at circuitry that is configured to generate a fixed and constant voltage regardless of power supply variations, temperature changes, and circuit loading of the circuitries.

The power-up voltage generator 209 can be configured to receive the power supply voltage as an input and generate a power-up voltage (e.g., shown as $V_{PU}$ in FIG. 2) based on the received power supply. As described herein, the power-up voltage generated at the power-up voltage generator 209 can be compared to the reference voltage generated at the reference voltage generator 207 for partially indicating whether the power supply voltage has reached a threshold voltage level.

The ready signal generator 211 can be configured to provide a ready signal (e.g., shown as READY in FIG. 2). As further illustrated in FIG. 5, the ready signal generator 211 can be a current mirror that can replicate a voltage based on the power supply voltage and output the ready signal when the replicated voltage has reached a threshold voltage level of a logic gate (e.g., inverter) coupled to an output of the ready signal generator 211.

That the power supply voltage is high sufficient to reset various internal components and/or circuitries of the memory sub-system (e.g., the memory sub-system 110 illustrated in FIG. 1) can be indicated at least partially based on a determination that the reference voltage has reached the power-up voltage. However, while a voltage level of the power supply voltage is relatively low, the reference voltage can be subject to a substantially large degree of a slew rate. As used herein, the term "slew rate" refers to a change of an electrical quantity, such as voltage or current, per unit of time (e.g., volts/second or amperes/second).

For example, while the power supply voltage is not high sufficient to properly operate the memory sub-system (e.g., memory sub-system 110 illustrated in FIG. 1), the reference voltage can temporarily reach a voltage level of the power-up voltage, and can possibly decrease again below the voltage level of the power-up voltage. Therefore, the reset signal that has been triggered when the reference voltage has temporarily reached the threshold voltage level may indeed misdirect to the memory sub-system to reset. Embodiments described herein can operate, therefore, the ready signal generator 211 to ensure that the reference voltage being output from the reference voltage generator 207 is steady, which indicates that the power supply voltage is indeed high sufficient to operate the memory sub-system properly.

The logic sub-component 214 can be configured to receive voltages/signals from the reference voltage generator 207, the power-up voltage generator 209, and the ready signal generator 211 as respective inputs, and provide a reset signal (e.g., shown as POR_OUT) based on comparisons among those inputs. For example, the logic sub-component 214 can be configured to output the reset signal based on a comparison of the reference voltage to the power-up voltage and an indication that the reference voltage has entered a steady state and is reliable as a measurement with respect to a voltage level of the power supply voltage. As described further in connection with FIG. 5, the indication can be determined based on a comparison of the replicated voltage generated at the ready signal generator 211 to a threshold voltage level of the logic gate coupled to the output of the ready signal generator 211. Further details of the logic sub-component 214 are illustrated in connection with FIG. 6.

Figure 3:
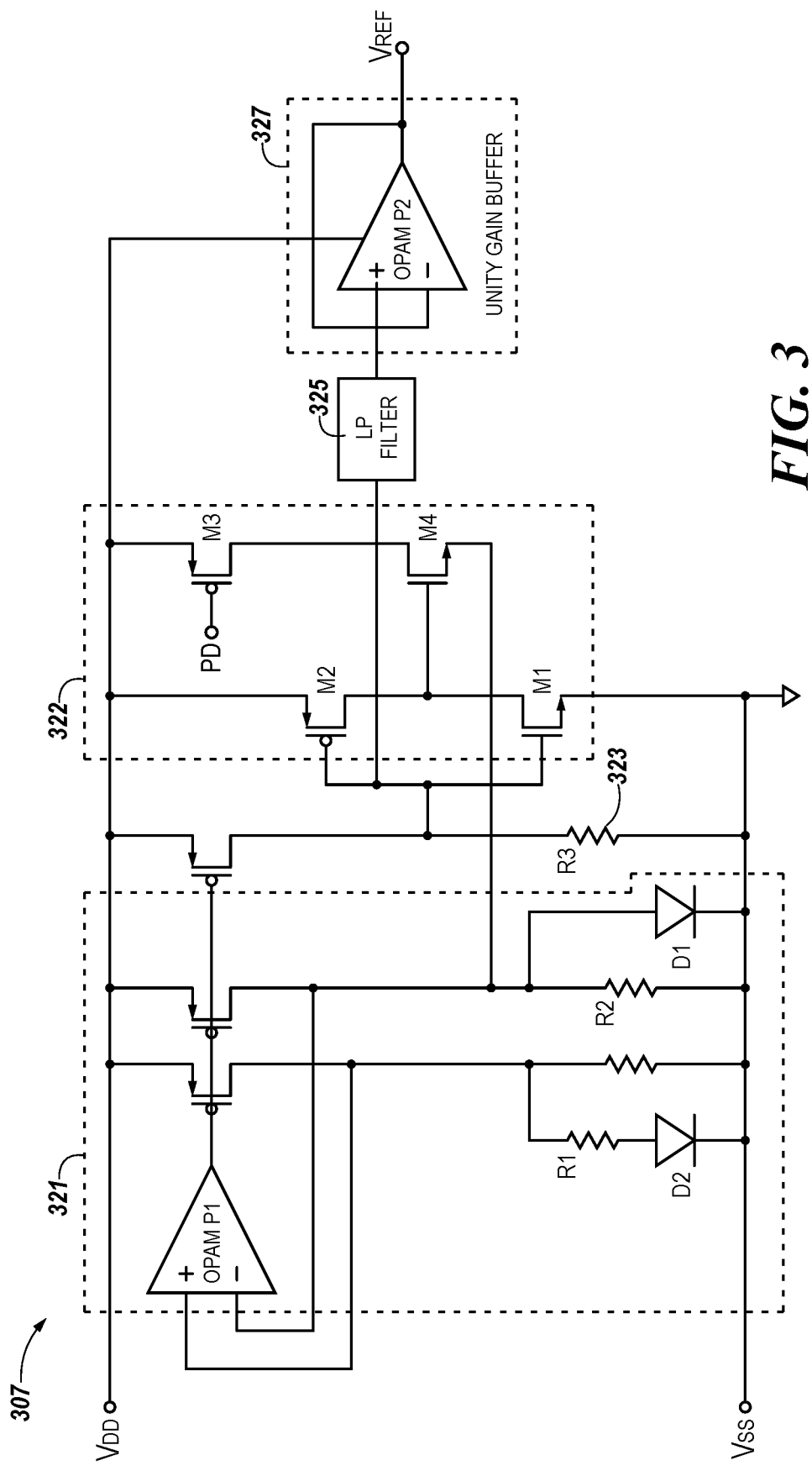
FIG. 3 illustrates an example reference voltage generator of a POR component in accordance with some embodiments of the present disclosure.

FIG. 3 illustrates an example reference voltage generator 307 of a POR component (e.g., the POR component 105 and 205 illustrated in FIG. 1 and FIG. 2) in accordance with some embodiments of the present disclosure. The reference voltage generator 307 can be analogous to the reference voltage generator 207 illustrated in FIG. 2.

The reference voltage generator 307 can include reference circuitry 321 that is configured to generate a voltage based on a power supply voltage (e.g., $V_{DD}$ as shown in FIG. 3). The reference circuitry 321 can include an operational amplifier, resistors, and diodes. Although embodiments are not so limited, the voltage generated utilizing the reference circuitry 321 can be a bandgap reference voltage. An output voltage of the reference circuitry 321 can be analogous to a voltage on a resistor 323.

The reference voltage generator 307 can include start-up circuitry 322 that is configured to provide, while the voltage being generated at the reference circuitry 321 has not reached a threshold (e.g., desired) voltage level, a signal (e.g., voltage) to the reference circuitry 321 such that the reference circuitry 321 can maintain increasing of the voltage. In some embodiments, the start-up circuitry can be configured to provide an input voltage to the reference circuitry 321 that helps, along with the power supply voltage, the reference circuitry 321 to generate and increase the reference voltage. When the voltage from the reference circuitry 321 has reached the threshold voltage level, the start-up circuitry 322 can turn off.

The start-up circuitry 322 can also include a power-down (PD) channel coupled to a transistor (e.g., M3 as shown in FIG. 3) that can be enabled to put the POR component (e.g., the POR component 105 and 205 illustrated in FIG. 1 and FIG. 2) into the powered-down state. Although embodiments are not so limited, two inverters can be coupled to the PD channel in series.

At its output, the reference voltage generator 307 can include a low pass (LP) filter 325 and an operational amplifier 327. The reference voltage generator 307 can operate the LP filter to filter noise from high frequency of the voltage provided from the reference circuitry 321. The filtered voltage can be output to the comparator (e.g., the comparator 614 illustrated in FIG. 6) as a reference voltage (e.g., shown as $V_{REF}$ in FIG. 3) via the operational amplifier 327, which can operate as a unity gain buffer that is an operational amplifier having a voltage gain of 1. In some embodiments, the operational amplifier 327 and the operational amplifier of the reference circuitry 321 can be structurally cascaded.

Figure 4:
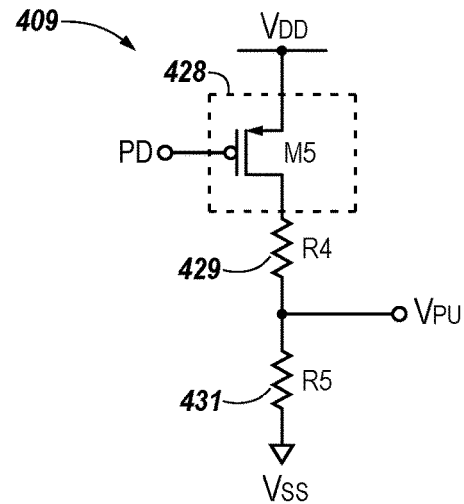
FIG. 4 illustrates an example power-up voltage generator of a POR component in accordance with some embodiments of the present disclosure.

FIG. 4 illustrates an example power-up voltage generator 409 of a POR component (e.g., the POR component 105 and 205 illustrated in FIG. 1 and FIG. 2) in accordance with some embodiments of the present disclosure. The power-up voltage generator 409 can be analogous to the power-up voltage generator 209 illustrated in FIG. 2.

As described herein, the power-up voltage generator 409 can receive a power supply voltage (e.g., $V_{DD}$ shown in FIG. 4), and generate and output a power-up voltage using transistors and resistors, such as a transistor 428, resistor 429, and a resistor 431. For example, the power-up voltage generator 409 can be configured to enable the transistor 428 having a gate coupled to an input configured to receive the power supply voltage (e.g., as well as to the PD channel). In some embodiments, the PD channel can be enabled to put the POR component in the powered-down state.

As described herein, the power-up voltage generated at the power-up voltage generator 409 can be compared to the reference voltage (e.g., generated at the reference voltage generator 207 and 307 illustrated in FIG. 2 and FIG. 3, respectively) to partially indicate whether the power supply voltage is high sufficient to reset the memory sub-system properly. A relatively simple structural aspects of the power-up voltage generator 409 can provide benefits such as being insensitive to PVT variation effects without experiencing sheet resistance effect.

Figure 5:
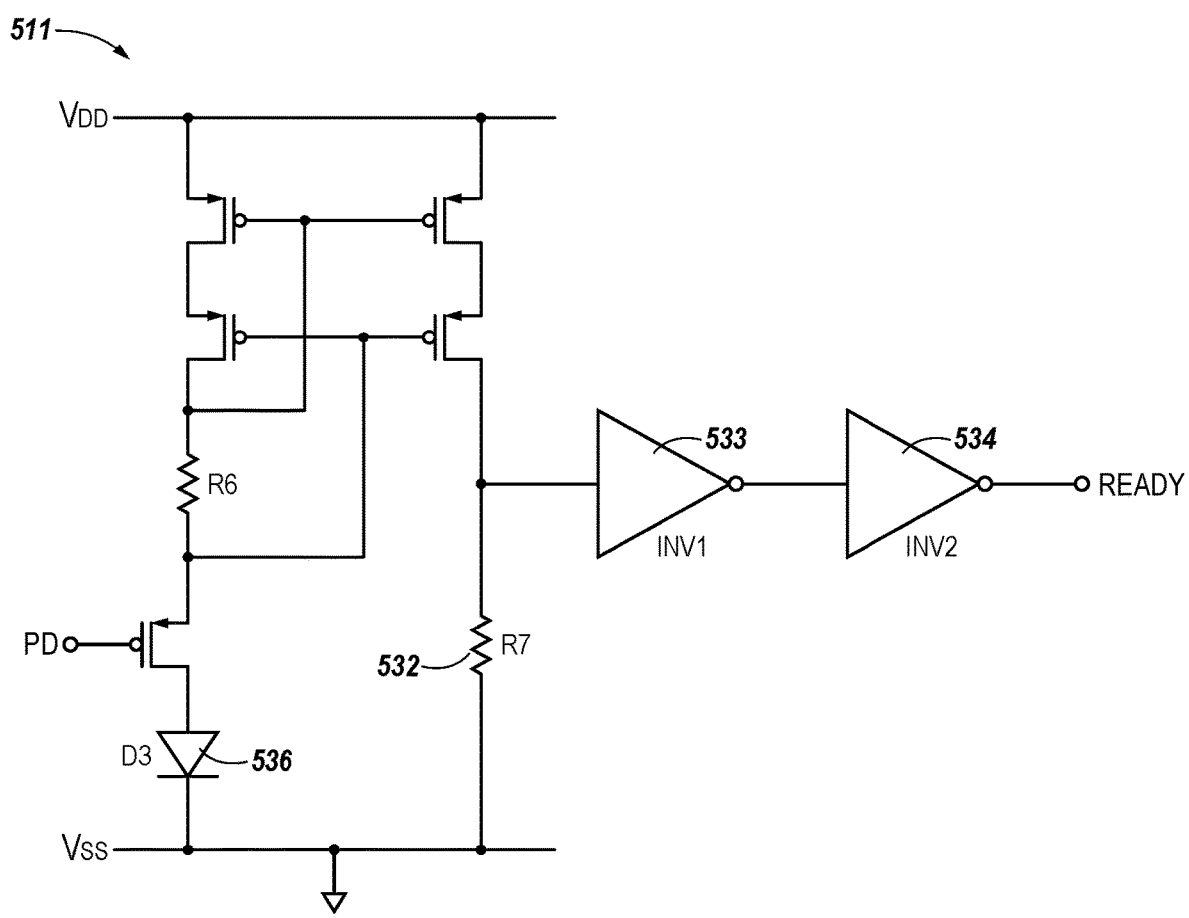
FIG. 5 illustrates an example ready signal generator of a POR component in accordance with some embodiments of the present disclosure.

FIG. 5 illustrates an example ready signal generator 511 of a POR component (e.g., the POR component 105 and 205 illustrated in FIG. 1 and FIG. 2) in accordance with some embodiments of the present disclosure. The ready signal generator 511 can be analogous to the ready signal generator 211 illustrated in FIG. 2. The ready signal generator 511 can include various circuitries, such as transistors, resistors, diodes, and/or logic gates. For example, the ready signal generator 511 can include a diode 536, resistor 532, a first logic gate 533, and a second logic gate 534, among others. The ready signal generator 511 can also include the PD channel, which can be enabled to put the POR component into the powered-down state.

The ready signal generator 511 can be a current mirror, such as a diode-based current mirror. As used herein, the term "current mirror" can refer to a device that can copy a current by replicating a voltage of its own or other devices. The ready signal generator 511 can receive a power supply voltage (e.g., shown as $V_{DD}$) as an input that can also increase a voltage on a diode 536. When the voltage on the diode 536 has reached a threshold voltage level of the diode 536, the diode 536 can conduct an amount of current through itself, which results in a current flow over a resistor 532. The ready signal generator 511 can initiate replicating, in response to the diode 536 being enabled, a voltage on the resistor 532 that is coupled to the first inverter 533.

Based on a voltage level of the replicated voltage, the first inverter 533 can provide an output signal that is binary in nature and representing binary logic values such as a logical high "1" or logical low "0". For example, the first inverter 533 can provide an output signal with the logical low when the voltage level of the replicated voltage reaches and/or exceeds a threshold voltage level of the first inverter 533, which can be analogous to a half of its output voltage, although embodiments are not so limited. In response to receipt of the signal from the first inverter 533, the ready signal generator 511 can provide, via the second inverter 534, a ready signal with having a logical high value to a logic gate, such as the logic gate 616 illustrated in FIG. 6.

Figure 6:
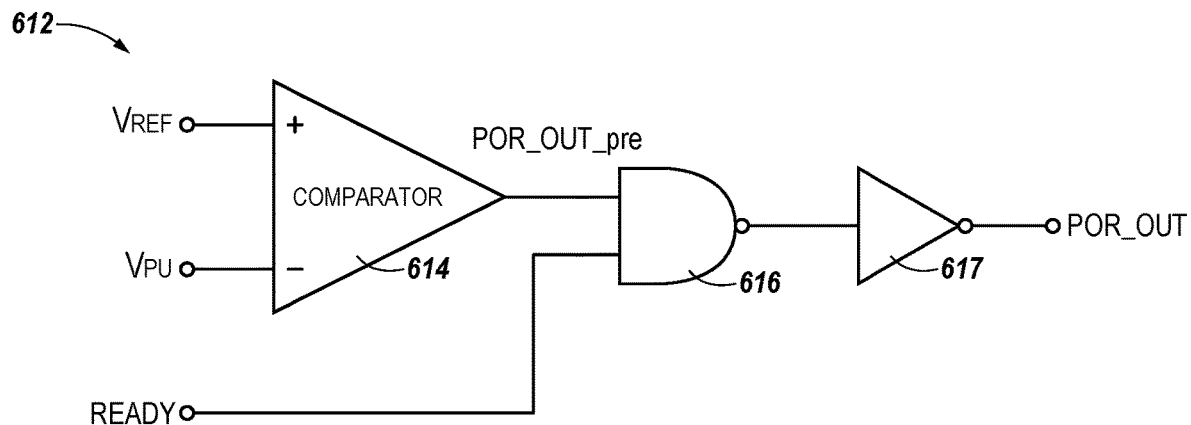
FIG. 6 illustrates an example logic sub-component of a POR component in accordance with some embodiments of the present disclosure.

FIG. 6 illustrates an example logic sub-component 612 of a POR component (e.g., the POR component 105 and 205 illustrated in FIG. 1 and FIG. 2) in accordance with some embodiments of the present disclosure. As illustrated in FIG. 6, the logic sub-component 612 includes a comparator 614, a first logic gate 616, and a second logic gate 617. The comparator 614 can receive (e.g., continuously monitor) a reference voltage (e.g., shown as $V_{REF}$ generated at the reference voltage generator 207 illustrated in FIG. 2) and a power-up voltage (e.g., shown as $V_{PU}$ generated at the reference voltage generator 207 illustrated in FIG. 2) as respective inputs as the input voltages are being increased in response to the power supply voltage increasing. In response to the inputs, the comparator 612 can be configured to compare the reference voltage and the power-up voltage to determine, for example, whether the reference voltage has reached the power-up voltage and provide a feedback signal based on the determination. For example, the feedback signal can indicate that the reference voltage level at a particular time has reached a voltage level of the power-up voltage at the particular time.

The first logic gate 616 can receive, as respective inputs, the feedback signal and the ready signal (e.g., shown as READY) respectively from the comparator 612 and the ready signal generator (e.g., the ready signal generator 211 illustrated in FIG. 2). The feedback signal and the ready signal can be binary in nature and can represent binary logic values such as a logical high "1" or logical low "0". For example, the feedback signal and the ready signal can be of a logical high to enable the first logic gate 616.

In response to the inputs, the logic sub-component 612 can provide, via the first logic gate 616 and the second logic gate 617, a reset signal (e.g., shown as POR_OUT) to various components and/or circuitries of the memory sub-system (e.g., memory sub-system 110 illustrated in FIG. 1). Although embodiments are not so limited, the first logic gate 616 can be a NAND gate and the second logic gate can be an inverter. For example, the first logic gate 616 as a NAND gate can provide an output signal having a logical low value when both of the signals received at the first logic gate 616 are of a logical high. In response to the output signal having a logical low value from the NAND gate, the second logic gate as an inverter can provide an output signal having a logical high value, which can be utilized as a reset signal.

Embodiments described herein can reduce the PVT variation effects on the POR component. For example, where the POR component described herein is implemented in 90 nanometer (nm) CMOS technology, the feedback signal ranges from 0.8 V to 1.32 V when measured under all PVT corners (e.g., fast-fast-fast to slow-slow-slow) over a temperature from −5° C. to 100° C. with a slew rate of 50 microseconds (µs). Under the same PVT corners with the slew rate of 50 µs, the ready signal ranges from 0.52 V to 1.0 V. Utilizing the feedback signal in combination with the ready signal results in a reset signal ranging from 0.88 V to 1.0 V with the slew rate from 50 µs to 10 s.

Figure 7:
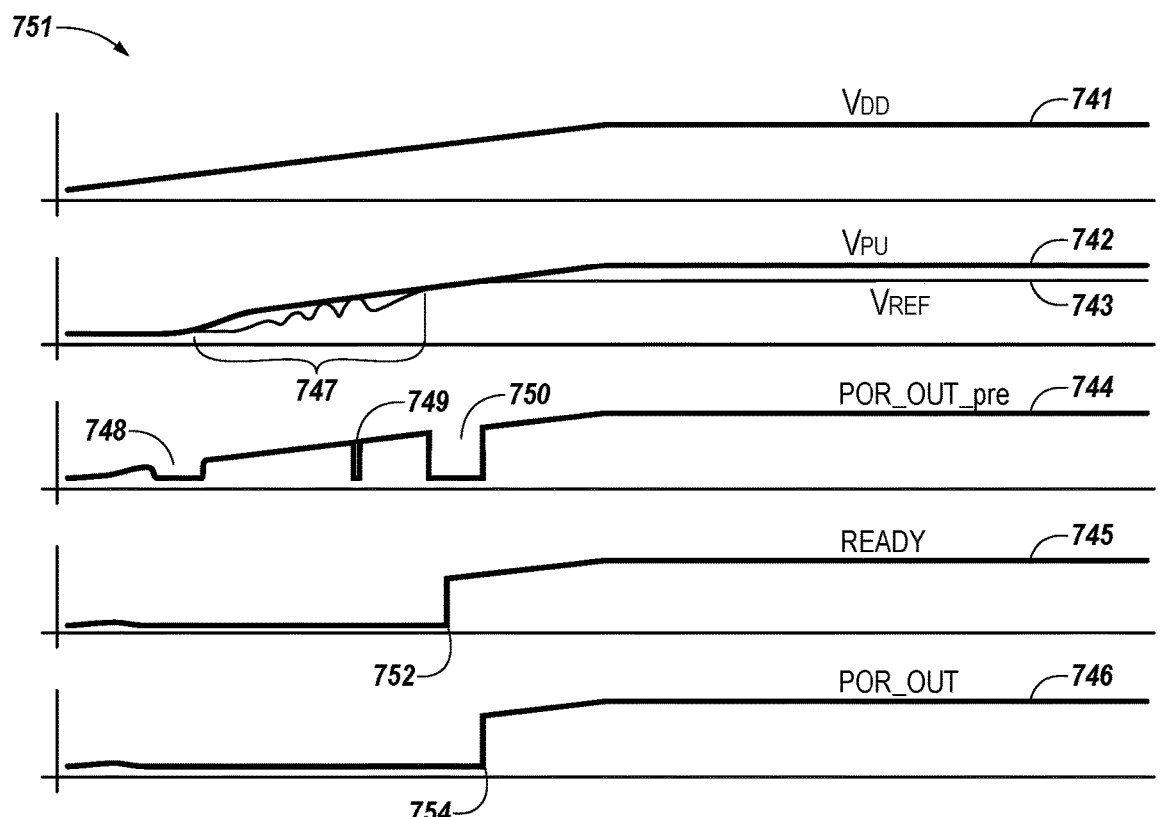
FIG. 7 illustrates an example of a graph illustrating changes in voltage levels of respective voltages/signals generated at each one of a plurality of voltage generators as a power supply voltage increases in accordance with some embodiments of the present disclosure.

FIG. 7 illustrates an example of a graph 751 illustrating changes in voltage levels of respective voltages/signals generated at each one of a plurality of voltage generators as a power supply voltage increases in accordance with some embodiments of the present disclosure. A voltage 741 (e.g., shown as $V_{DD}$ in FIG. 7) can be analogous to the power supply voltage described herein. Further, a voltage 743 (e.g., shown as $V_{REF}$ in FIG. 7) and a voltage 742 (e.g., shown as $V_{PU}$ in FIG. 7) can be analogous to the reference voltage (e.g., generated at the reference voltage generator 207 and 307 illustrated in FIG. 2 and FIG. 3) and the power-up voltage (e.g., generated at the power-up voltage generator 209 and 409 illustrated in FIG. 2 and FIG. 4), respectively. Further, a voltage corresponding to a signal 744 (e.g., shown as POR_OUT_pre in FIG. 7), a voltage corresponding to a signal 745 (e.g., shown as READY in FIG. 7), and a voltage corresponding to a signal 746 (e.g., shown as POR_OUT in FIG. 7) can be analogous to a voltage corresponding to the feedback signal (e.g., generated at the comparator 612 illustrated in FIG. 6), a voltage corresponding to the ready signal (e.g., generated at the ready signal generator 211 and 511 illustrated in FIG. 2 and FIG. 5), and a voltage corresponding to the reset signal (e.g., generated at the logic sub-component 214 and 614 illustrated in FIG. 2 and FIG. 6), respectively.

As shown in the graph 751, as the power supply voltage 741 increases, the power-up voltage 742 and the reference voltage 743 that are generated based on the power supply voltage 741 increase as well. During an interval 747, a slew rate of the reference voltage 743 can be relatively large due to the reference voltage 743 being not steady (e.g., unstable) while the power supply voltage is relatively low, which increases and decreases the reference voltage 743, for example, above or below a voltage level of the power-up voltage 742 during the interval 747. Therefore, the feedback signals triggered at 748 and 749 (e.g., during the interval 747) are not reliable as a measurement for indicating that a voltage level of the power supply voltage is high sufficient to reset. To prevent the reset signal from being triggered in these instances, the ready signal can be utilized to filter the feedback signal 744 by ignoring the feedback signals at 748 and 749. For example, as illustrated in FIG. 7, the reset signal can be prevented from being output until the ready signal is triggered a time 752 despite the feedback signals 748 and 749. Accordingly, the reset signal is triggered at a time 754 (e.g., subsequent to the time 752).

Figure 8:
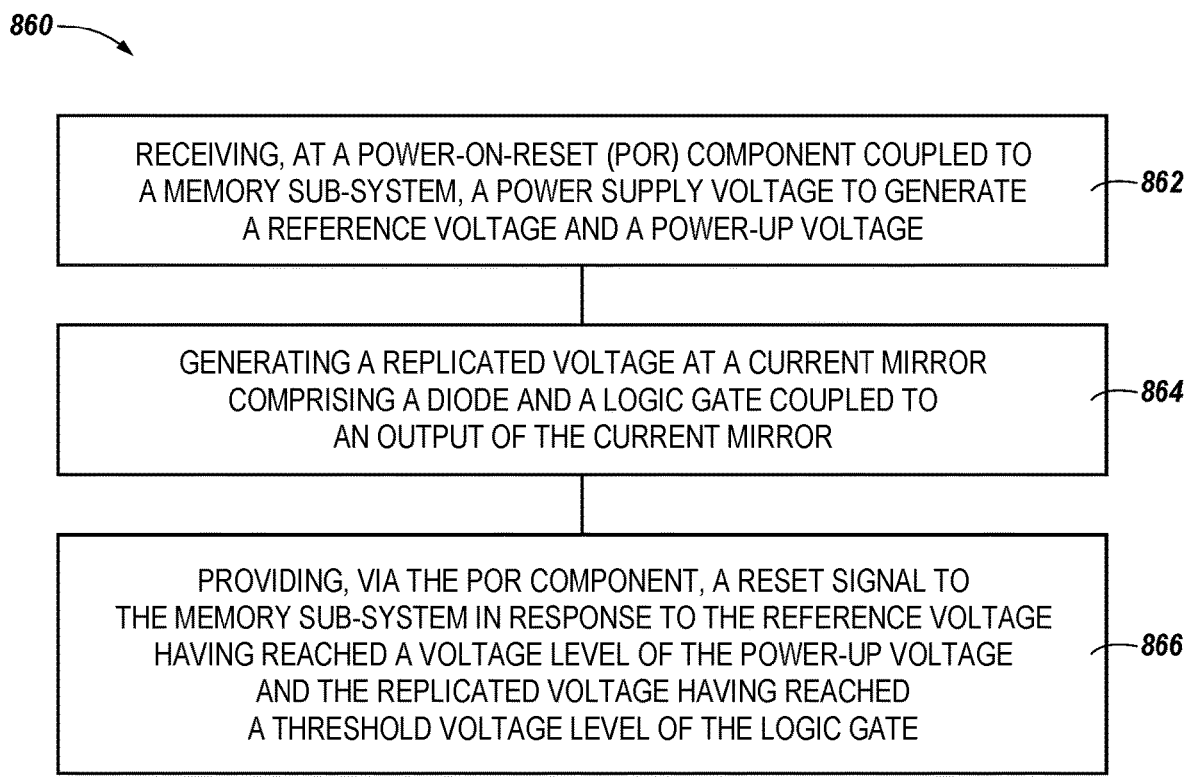
FIG. 8 illustrates a flow diagram of an example method for operating a POR component in accordance with some embodiments of the present disclosure.

FIG. 8 illustrates a flow diagram 860 of an example method for operating a POR component in accordance with some embodiments of the present disclosure. At block 862, the POR component (e.g., the POR component 105 and 205 illustrated in FIG. 1 and FIG. 2) can receive a power supply voltage as an input. As illustrated in FIG. 1, the POR component can be coupled to (e.g., included in) a memory sub-system (e.g., memory sub-system 110 illustrated in FIG. 1). In response to the power supply voltage, the POR component can further generate a reference voltage (e.g., a voltage generated at the reference voltage generator 207 and 307 illustrated in FIG. 2 and FIG. 3) and a power-up voltage (e.g., a voltage generated at the power-up voltage generator 209 and 409 illustrated in FIG. 2 and FIG. 4).

At block 864, the POR component can generate a replicated voltage at a current mirror (the ready signal generator

211 and 511 illustrated in FIG. 2 and FIG. 5). The current mirror can include a diode (e.g., diode 536 illustrated in FIG. 5) and a logic gate (e.g., inverter 533 illustrated in FIG. 5) coupled to an output of the current mirror. In some embodiments, the replicated voltage can be generated in response to a voltage on the diode having reached a threshold voltage level of the diode. In some embodiments, the replicated voltage can be a voltage on a resistor coupled to the diode and the logic gate of the current mirror.

At block 866, the POR component can provide the reset signal to the memory sub-system in response to the reference voltage having reached the power-up voltage and the replicated voltage having reached a threshold voltage level of the logic gate of the current mirror. Stated alternatively, the POR component can prevent the reset signal from being provided to the memory sub-system in response to at least one of the reference voltage having not reached the power-up voltage or the replicated voltage having not reached the threshold voltage level. As described herein, the replicated voltage having reached the threshold voltage of the logic gate coupled to the output of the current mirror can indicate that the reference voltage has entered a steady state and is reliable as a measurement with respect to a voltage level of the power supply voltage.

Figure 9:
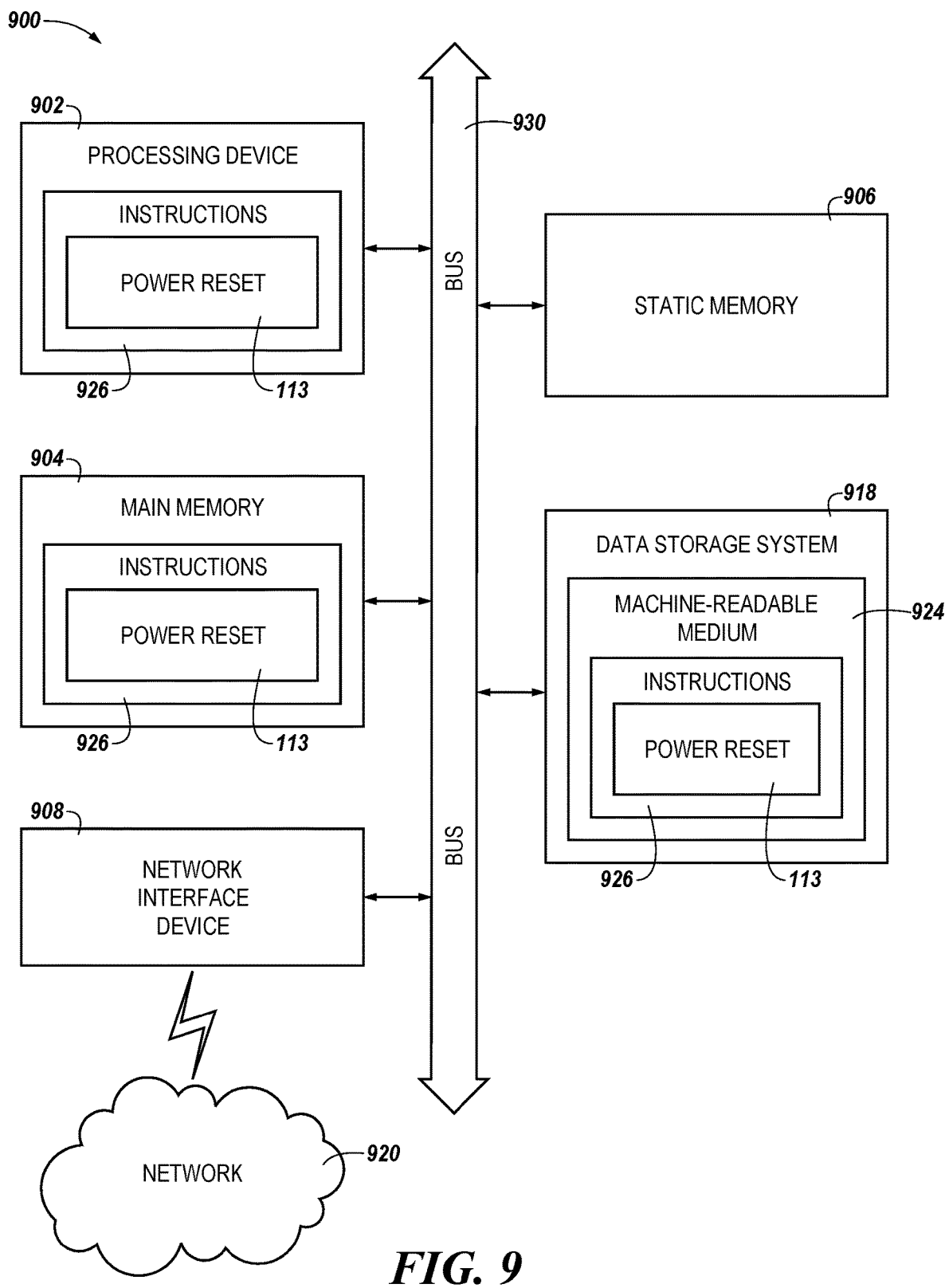
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power reset 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

The processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a power reset component (e.g., the power reset component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a voltage generator configured to generate a reference voltage, a power-up voltage, and a replicated voltage based on a power supply voltage, wherein the voltage generator comprises a current mirror configured to generate the replicated voltage; and
   a logic sub-component coupled to the voltage generator and configured to output a reset signal based on:
      a comparison of the reference voltage to the power-up voltage; and
      an indication that the reference voltage has entered a steady state and is reliable as a measurement with respect to a voltage level of the power supply voltage, wherein the indication is determined based on a comparison of the replicated voltage to a particular threshold voltage level, and wherein the particular threshold voltage level corresponds to a threshold voltage level of a logic gate coupled to an output of the current mirror.

2. The system of claim 1, wherein the logic sub-component is configured to indicate that the reference voltage has entered the steady state in response to the replicated voltage having reached the particular threshold voltage level.

3. The system of claim 1, wherein the logic sub-component is configured to prevent the reset signal from being output prior to the reference voltage entering the steady state.

4. The system of claim 1, wherein:
   the logic gate is an inverter; and
   the threshold voltage level of the logic gate corresponds to a threshold voltage level of the inverter.

5. The system of claim 1, wherein the logic sub-component further comprises a comparator configured to output a feedback signal in response to the reference voltage having reached a voltage level of the power-up voltage.

6. The system of claim 1, wherein the voltage generator comprises a reference voltage generator at which the reference voltage is generated, and wherein the reference voltage generator comprises a unity gain buffer whose output is provided to the logic sub-component.

7. The system of claim 6, wherein the reference voltage generator comprises start-up circuitry configured to maintain a generation of the reference voltage until the reference voltage reaches a threshold.

8. The system of claim 6, wherein the reference voltage generator comprises bandgap reference voltage circuitry.

9. The system of claim 8, wherein the reference voltage generator comprises a low pass filter configured to filter noise from an output voltage generated from the bandgap reference voltage circuitry.

10. A system, comprising:
    a logic sub-component configured to:
       receive, along with a ready signal from a current mirror, a reference voltage and a power-up voltage that are generated based on a power supply voltage, wherein the ready signal is received at the logic sub-component in response to a replicated voltage generated at the current mirror having reached a threshold voltage level of a logic gate coupled to an output of the current mirror; and
       prevent a reset signal from being output from the logic sub-component in response to at least one of:
          a determination that the reference voltage has not reached a voltage level of the power-up voltage; or
          a determination, based on the ready signal, that the replicated voltage has not reached the threshold voltage level, wherein the replicated voltage having not reached the threshold voltage level indicates that the reference voltage has not entered a steady state and is not reliable as a measurement with respect to a voltage level of the power supply voltage.

11. The system of claim 10, further comprising a comparator configured to:
    receive the reference voltage and the power-up voltage as respective inputs; and
    provide a feedback signal based on a comparison of the reference voltage to the power-up voltage.

12. The system of claim 11, wherein the comparator is configured to provide the feedback signal in response to the reference voltage having reached a voltage level of the power-up voltage.

13. The system of claim 10, further comprising a logic gate coupled to a comparator and the current mirror and configured to:

receive the ready signal from the current mirror and a feedback signal from the comparator as respective inputs; and provide a reset signal in response to receipt of the ready signal and the feedback signal, wherein:
the feedback signal indicates that the reference voltage has reached a voltage level of the power-up voltage; and
the ready signal indicates that the replicated voltage has reached the threshold voltage level of the current mirror.

14. The system of claim 13, wherein the comparator is configured to compare a voltage level of the reference voltage to a voltage level of the power-up voltage, wherein the voltage level of the power-up voltage is measured at a time at which the voltage level of the reference voltage is also measured.

15. The system of claim 13, wherein the logic gate is one of a plurality of logic gates of the logic sub-component comprising at least one of:
a NAND gate; or
an inverter.

16. The system of claim 10, wherein the reference voltage is a bandgap reference voltage.

17. A method, comprising:
receiving, at a power-on-reset (POR) component coupled to a memory sub-system, a power supply voltage, wherein a reference voltage and a power-up voltage are generated based on the power supply voltage;
generating a replicated voltage at a current mirror comprising a diode and a logic gate coupled to an output of the current mirror, wherein the replicated voltage is generated in response to a voltage on the diode having reached a threshold voltage level of the diode; and
providing, via the POR component, a reset signal to the memory sub-system in response to:
the reference voltage having reached a voltage level of the power-up voltage; and
the replicated voltage having reached a threshold voltage level of the logic gate, which indicates that the reference voltage has entered a steady state and is reliable as a measurement with respect to a voltage level of the reference voltage.

18. The method of claim 17, further comprising:
preventing the reset signal from being provided to the memory sub-system in response to at least one of:
the reference voltage having not reached a voltage level the power-up voltage; or
the replicated voltage having not reached the threshold voltage level of the logic gate.

19. The method of claim 17, wherein the current mirror comprises a resistor coupled to the diode, and the method further comprises generating the replicated voltage by replicating a voltage on the resistor.

20. A system, comprising:
a voltage generator configured to generate a reference voltage, a power-up voltage, and a replicated voltage based on a power supply voltage, wherein the voltage generator comprises a reference voltage generator at which the reference voltage is generated, and wherein the reference voltage generator comprises a unity gain buffer whose output is provided to a logic sub-component; and
the logic sub-component coupled to the voltage generator and configured to output a reset signal based on:
a comparison of the reference voltage to the power-up voltage; and
an indication that the reference voltage has entered a steady state and is reliable as a measurement with respect to a voltage level of the power supply voltage, wherein the indication is determined based on a comparison of the replicated voltage to a particular threshold voltage level.

* * * * *